(12) United States Patent
Maes

(10) Patent No.: US 6,818,517 B1
(45) Date of Patent: Nov. 16, 2004

(54) METHODS OF DEPOSITING TWO OR MORE LAYERS ON A SUBSTRATE IN SITU

(75) Inventor: Jan Willem Maes, Wilrijk (BE)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/652,851

(22) Filed: Aug. 29, 2003

(51) Int. Cl.[7] ................ H01L 21/336; H01L 21/3205; H01L 21/4763
(52) U.S. Cl. .............. 438/287; 438/585; 438/586
(58) Field of Search .......................... 438/287, 533, 438/585, 586, 595, 690

(56) References Cited

U.S. PATENT DOCUMENTS

| | | |
|---|---|---|
| 4,058,430 A | 11/1977 | Suntola et al. |
| 4,420,385 A | 12/1983 | Hartsough |
| 4,560,590 A | 12/1985 | Bok |
| 4,798,165 A | 1/1989 | deBoer et al. |
| 4,840,921 A | 6/1989 | Matsumoto |
| 4,931,132 A | 6/1990 | Aspnes et al. |
| 5,166,092 A | 11/1992 | Mochizuki et al. |
| 5,374,570 A | 12/1994 | Nasu et al. |
| 5,420,072 A | 5/1995 | Fiordalice et al. |
| 5,443,647 A | 8/1995 | Aucoin et al. |
| 5,711,811 A | 1/1998 | Suntola et al. |
| 5,772,770 A | 6/1998 | Suda et al. |
| 5,788,425 A | 8/1998 | Skow et al. |
| 5,841,490 A | 11/1998 | Matsuo |
| 5,851,849 A | 12/1998 | Comizzoli et al. |
| 5,879,459 A | 3/1999 | Gadgil et al. |
| 5,905,548 A | 5/1999 | Shimada |
| 5,998,236 A | 12/1999 | Roeder et al. |
| 6,008,083 A | 12/1999 | Brabazon et al. |
| 6,124,158 A | 9/2000 | Dautartas et al. |
| 6,144,060 A | 11/2000 | Park et al. |
| 6,313,047 B2 | 11/2001 | Hasebe et al. |
| 6,358,829 B2 | 3/2002 | Yoon et al. |
| 6,369,430 B1 * | 4/2002 | Adetutu et al. ............. 438/586 |
| 6,492,283 B2 | 12/2002 | Raaijmakers et al. |
| 6,544,900 B2 | 4/2003 | Raaijmakers et al. |
| 6,551,399 B1 * | 4/2003 | Sneh et al. ................ 117/102 |
| 6,592,942 B1 | 7/2003 | Van Wijck |
| 6,638,863 B2 * | 10/2003 | Wang et al. .............. 438/690 |
| 6,660,622 B2 * | 12/2003 | Chen et al. ............... 438/595 |
| 6,674,138 B1 * | 1/2004 | Halliyal et al. ............ 257/411 |
| 6,743,681 B2 * | 6/2004 | Bhattacharyya ............ 438/287 |
| 6,750,126 B1 * | 6/2004 | Visokay et al. ............ 438/585 |

FOREIGN PATENT DOCUMENTS

| | | |
|---|---|---|
| EP | 0 308 946 A2 | 3/1989 |
| EP | 340113 A1 | 11/1989 |
| EP | 1 167 567 A1 | 1/2002 |
| WO | WO 96/17969 | 6/1996 |
| WO | WO 96/17973 | 6/1996 |
| WO | WO 98/01890 | 1/1998 |
| WO | WO 99/28527 | 6/1999 |

OTHER PUBLICATIONS

Ritala, et. al., "*Effects of intermediate zinc pulses on properties of TiN and NbN films deposited by atomic layer epitaxy,*" Applied Surface Science, vol. 120, pp. 199–212, Elsevier Science B.V., Jul. 22, 1997.

(List continued on next page.)

*Primary Examiner*—John F. Niebling
*Assistant Examiner*—Walter L. Lindsay, Jr.
(74) *Attorney, Agent, or Firm*—Knobbe, Martens, Olson & Bear LLP

(57) ABSTRACT

The present invention provides methods of depositing two or more layers on a substrate in situ. In particular, methods are provided for forming a high-k dielectric gate stack on a substrate. Preferably, a high-k dielectric oxide, such as $HfO_2$, $HfSiO_4$, $ZrO_2$ or $ZrSiO_4$, are deposited on a substrate in a reaction chamber by an atomic layer deposition (ALD) process. A silicon nitride layer is deposited on the substrate by a chemical vapor deposition (CVD) process, preferably a remote plasma enhanced chemical vapor deposition (RPECVD) process. Preferably, the ALD process and the RPECVD process are carried out under substantially isothermal conditions in the same reactor.

35 Claims, 3 Drawing Sheets

OTHER PUBLICATIONS

Kukli, et al., *"In situ study of atomic layer epitaxy growth of tantalum oxide thin films from Ta(OC2H5)5 and H20,"* Applied Surface Science, vol. 112, pp. 236–242, Elsevier Science B.V. 1997.

Ritala and Leskela, *"Zirconium dioxide thin films deposited by ALE using zirconium tetrachloride as a precursor,"* Applied Surface Science, pp. 1–8, Elsevier Science B.V. Jun. 23, 1993.

M.Y. Ho, H. Gong, G.D. Wilk, B.W. Busch, M.L. Green, W.H. Lin, A. See, S.K. Lahiri, M.E. Loomans, P. I. Raisanen and T. Gustafsson, *"Suppressed crystallization of Hf–based gate dielectrics by controlled addition of Al2O3 using atomic layer deposition,"* Applied Physics Letters, vol. 81, No. 22, dated Nov. 25, 2002, pp. 4218–4220.

A. Nakajima, T. Kidera, H. Ishii and S. Yokoyama, *"Atomic–layer deposition of ZrO2 with a Si nitride barrier layer,"* Applied Physics Letters, vol. 81, No. 15, dated Oct. 7, 2002, pp. 2824–2826.

* cited by examiner

METHODS OF DEPOSITING TWO OR MORE LAYERS ON A SUBSTRATE IN SITU

FIELD OF THE INVENTION

The invention relates to the field of semiconductor processing and particularly to the deposition of two or more layers on a substrate in situ.

BACKGROUND OF THE INVENTION

Thermal $SiO_2$ and SiON cannot meet gate dielectric leakage current requirements at the 65 nm or 45 nm technology node and beyond. As a result, replacement dielectric materials are necessary. An important group of candidate materials are Hf based oxides such as $HfO_2$, $HfAl_xO_y$, HfSiO and HfSiON. Hafnium oxide ($HfO_2$) can be deposited very well by atomic layer deposition (ALD) from $HfCl_4$ and $H_2O$ at about 300° C. and is found to have good high-temperature stability and low leakage currents. However, $HfO_2$ exhibits a high diffusion coefficient for oxygen and when a polysilicon layer is deposited by CVD at 620° C. directly on top of the $HfO_2$ layer, electrically shorted devices are often obtained.

The addition of silicon and nitrogen to a $HfO_2$ based gate stack can enhance the properties of the gate stack. One possible way to add silicon and nitrogen to a $HfO_2$ based gate stack is to combine $HfO_2$ deposition with $Si_3N_4$ deposition. This can be achieved simply by combining the $HfO_2$ deposition process with a silicon nitride deposition process. For example, formation of a high-k gate dielectric stack can comprise a single deposition of $HfO_2$ followed by a single deposition of a thin silicon nitride layer. Preferably the $HfO_2$ deposition is preceded by the formation of a silicon oxide or silicon oxynitride interface layer about 0.3 to about 1.5 nm thick. This interface layer can be a chemical oxide, a thermally grown oxide or oxynitride or a film grown using excited species from a plasma. Alternatively, an interface oxide can be formed by oxidation after deposition of the high-k film.

The high-k gate dielectric stack can comprise a more advanced sequence of alternating depositions. Examples include $Si_3N_4$-$HfO_2$-$Si_3N_4$, $HfO_2$-$Si_3N_4$-$HfO_2$-$Si_3N_4$-$HfO_2$-$Si_3N_4$-$HfO_2$-$Si_3N_4$.

Although the ALD technique is perfectly suited for the deposition of $HfO_2$ films, the deposition of silicon nitride by ALD has been problematic due to the lack of suitable source materials. It is difficult to avoid the incorporation of large amounts of carbon in the deposition of nitride films by ALD. Therefore, a remote plasma enhanced CVD (RPECVD) process has been used to deposit the silicon nitride film in high-k dielectric stacks. In a typical process, $SiH_4$ is used as the silicon source gas and N* radicals are generated in a remote plasma chamber. The deposition is carried out at a substrate temperature of about 650° C. See, for example, U.S. Pat. No. 6,534,900, issued Apr. 8, 2003, incorporated herein by reference in its entirety.

To deposit a high-k dielectric stack, the $HfO_2$ film is deposited in an ALD reaction chamber, operated at a temperature optimized for the ALD process, for example about 300° C., and the silicon nitride process is deposited in a separate RPECVD chamber operated at a temperature of about 650° C. When a stack of alternating $HfO_2$ and silicon nitride films is deposited, it is necessary to transport the substrate back and forth between the two reaction chambers, which is time consuming and increases the risk of wafer contamination or other detrimental effects.

SUMMARY OF THE INVENTION

In accordance with one aspect of the invention, a method is provided for forming a gate dielectric stack on a semiconductor substrate in situ. The method includes loading the substrate into a reaction chamber. A high-k dielectric layer comprising metal oxide is deposited onto the substrate within the chamber by atomic layer deposition (ALD). A silicon nitride layer is deposited onto the substrate in the same chamber under substantially isothermal conditions with the ALD process. Preferably the silicon nitride layer is deposited by a chemical vapor deposition (CVD) process, more preferably by remote plasma enhanced chemical vapor deposition (RPECVD).

In some embodiments the silicon nitride layer is deposited over the high-k metal oxide. In other embodiments, the silicon nitride layer is deposited prior to deposition of the high-k metal oxide.

The substantially isothermal conditions preferably comprise temperatures that differ by less than about 50° C. In one embodiment, the ALD process and the RPECVD process are carried out at temperatures from about 250° C. and about 400° C. In a particular embodiment both processes are carried out at a temperature from about 295° C. to about 305° C.

The metal oxide is preferably selected from the group consisting of oxides of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof, including mixtures comprising Si. Particularly preferred oxides include $HfO_2$, $HfSiO_z$, $ZrO_2$ and $ZrSiO_z$, wherein z is preferably 4. The silicon nitride preferably comprises $Si_3N_4$.

In accordance with another aspect of the invention, a process is provided for forming a gate dielectric stack in an integrated transistor on a semiconductor substrate. One or more high-k dielectric dielectric layers are deposited on the semiconductor substrate in a processing chamber by an ALD process. Alternatingly with the one or more high-k dielectric oxide layers, one or more silicon nitride layers are deposited by an RPECVD process at substantially isothermal conditions without removing the substrate from the processing chamber.

In another aspect, the invention provides a method of depositing two or more layers on a substrate in situ by depositing a first layer on a substrate in a reaction chamber by an ALD process and depositing a second layer on the substrate in the reaction chamber by an RPECVD process. Preferably the ALD and RPECVD processes are conducted under substantially isothermal conditions.

DETAILED DESCRIPTION OF THE PREFERRED EMBODIMENTS

The present disclosure provides methods useful in the fabrication of integrated circuits, particularly in the formation of dielectric stacks, including, for example, transistor gate dielectric stacks and memory cell capacitor dielectric stacks. In the preferred embodiments, multiple processing steps are conducted in situ. For example, an ALD process and a plasma enhanced CVD process are carried out in situ.

As used herein, the term "in situ" indicates that the steps are conducted within the same chamber, and preferably the substrate is not removed from the processing chamber between steps.

It will be understood that the term "substrate" refers to any surface on which a layer is to be deposited. The preferred substrate includes a semiconductor structure, such as an epitaxial silicon layer or the top surface of a monolithic silicon wafer. In this context, the skilled artisan will appreciate that the semiconductor structure is the lowest level of semiconductor material from which devices are formed in an integrated circuit.

The term "deposition temperature" is used herein to refer to the set point or target temperature of the substrate during the deposition process. One of skill in the art will recognize that the actual substrate temperature might differ somewhat from the temperature set point due to slight imperfections in the temperature control system.

The processing steps preferably include an ALD process step for the deposition of a high-k dielectric oxide layer and a silicon nitride deposition step using nitrogen radicals.

In some embodiments, deposition of the first layer in the dielectric stack, either a high-k dielectric layer or a layer of silicon nitride, is preceded by the formation of a silicon oxide or silicon oxynitride interface layer. Preferably, the interface layer has a thickness of from about 0.3 to about 1.5 nm. The interface layer may be formed by any method known in the art. Exemplary methods are described in U.S. Pat. No. 6,492,283, issued, Dec. 10, 2002, incorporated herein by reference in its entirety.

Figure 2:
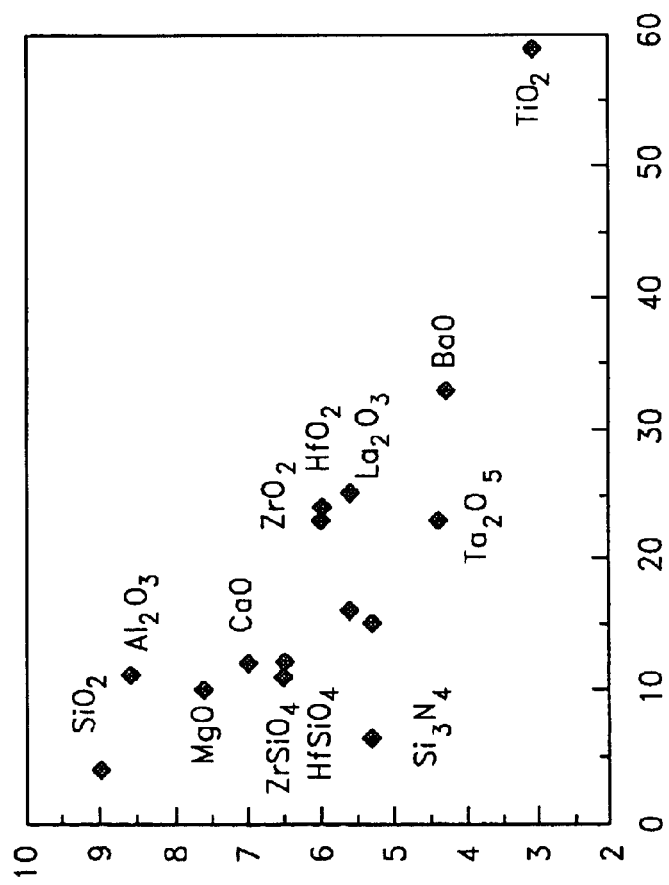
FIG. 2 is a chart of the dielectric constant (k) values versus bandgap for a variety of metal oxides.

In the preferred embodiment, a layer of a high-k dielectric oxide is deposited on a substrate by an atomic layer deposition process. High-k oxides are defined as oxides with a dielectric constant greater than that of $SiO_2$ and that are stable relative to silicon. FIG. 2 is a graph of a number of exemplary oxides and their k values. Preferred oxides have a k value greater than 10, more preferably greater than 15. In addition, preferred high-k oxides do not react with silicon in any of the following reactions, where M is a metal:

$$Si+MO_x \rightarrow M+SiO_2 \qquad (I);$$

$$Si+MO_x \rightarrow MSi_x+SiO_2 \qquad (II); and$$

$$Si+MO_x \rightarrow M+MSi_xO_y \qquad (III).$$

Preferred high-k oxides include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and mixtures thereof, including mixtures with Si and $SiO_2$ (i.e., silicates). Particularly preferred high-k oxides are oxides of Hf and Zr. Other high-k materials that may be used include barium strontium titanate (BST), strontium tantalate (ST), $Nb_2O_5$, solid solutions of metal oxides and nanolaminates of metal oxides. In some embodiments high-k oxides other than silicon oxides and/or aluminum oxides are used.

In the preferred embodiments, the high-k dielectric oxide is preferably selected from the group consisting of $HfO_2$, $HfSiO_z$, $ZrO_2$ and $ZrSiO_z$, wherein z is preferably 4. Even more preferably, the high-k dielectric oxide is $HfO_2$.

The high-k dielectric oxide is preferably deposited on a substrate by atomic layer deposition (ALD). For the purpose of the present description, an "ALD process" designates a process in which deposition of material onto a surface is based on sequential and alternating self-saturating surface reactions. The general principles of ALD are disclosed, e.g., in U.S. Pat. Nos. 4,058,430 and 5,711,811, the disclosures of which are incorporated herein by reference. Generally, conditions for ALD include a reaction temperature window wherein the substrate is above the temperature at which source gases condense and below the temperature at which the source gases thermally decompose.

Thus, in forming the high-k dielectric layer, alternating pulses of metal precursors and oxygen precursors are provided to the reaction space. Each pulse of reactants saturates the surface in a self-limiting manner. The layer left by a pulse is self-terminated with a surface that is non-reactive with the remaining chemistry of that pulse. Maximum step coverage on the substrate surface is obtained when no more than about a single molecular layer of source chemical molecules is chemisorbed in each pulse. Reactants are thus selected such that, under the preferred conditions, the amount of reactants that can be bound to the surface is determined by the number of available sites and incidentally by the physical size of the chemisorbed species (including ligands). Each subsequent pulse reacts with the surface left by the preceding pulse in a similarly self-limiting or self-terminating manner, such that each cycle of pulses leaves no more than about 1 monolayer of the dielectric material Briefly, a vapor phase pulse of a metal source chemical is introduced into the reaction space and contacted with the substrate surface. After a first contact time the surplus metal source chemical and any possible reaction byproducts are removed from the reaction space by varying the reaction space pressure and/or by inert gas flow. After a first purging time a vapor phase pulse of an oxygen source is introduced into the reaction chamber and contacted with the substrate surface. After a second contact time the surplus oxygen source chemical and any possible reaction byproducts are removed from the reaction space by varying the reaction space pressure and/or by inert gas flow. After a second purging time the illustrated process cycle is repeated until a high-k oxide thin film of a desired thickness is obtained.

The pulsing sequence is repeated until a dielectric layer of the desired thickness is deposited. Preferably, the dielectric layer has a thickness of between about 1 nm and about 5 nm, more preferably between about 2 nm and about 4 nm, and most preferably about 3 nm. Multiple dielectric layers can be provided in a gate stack. In some embodiments, the total thickness of all of the dielectric layers in a multi-layer gate stack is between about 1 nm and about 5 nm, more preferably between about 2 nm and about 4 nm and most preferably about 3 nm. For example, in a multi-layer gate stack with two dielectric layers, each dielectric layer may have a thickness of about 1.5 nm.

The ALD process is preferably carried out at less than 400° C., more preferably at a temperature of about 300° C. or less. Most preferably the ALD process is carried out a temperature that is as close as possible to the temperature of the process that is used for depositing silicon nitride.

An exemplary ALD process uses $HfCl_4$ and $H_2O$ as source materials for metal (Hf) and oxygen respectively. In one embodiment the ALD process is carried out at about 300° C.

In an exemplary process, $HfCl_4$ vapor is introduced to the reaction chamber and exposed to the substrate surface for 1.5 s. The reaction chamber is purged with an inert gas, for example with nitrogen gas, for 3.0 s to remove surplus $HfCl_4$ and byproducts from the reaction chamber. Then water vapor is introduced to the reaction chamber and exposed to the substrate surface for 3.0 s. Residual water vapor and reaction byproducts are removed by purging the reaction chamber for 4.0 s. During each of the reaction phases, the reactants are supplied in sufficient quantity, given other parameters, to saturate the surface.

In the preferred embodiment, a layer of silicon nitride is subsequently deposited over the high-k dielectric oxide in the same reaction space. In other embodiments, however, the silicon nitride is deposited first, followed by deposition of the high-k oxide in the same reaction space.

Whether deposited before the high-k dielectric or after, the silicon nitride layer is preferably deposited by a method that is able to be conducted efficiently at low temperatures, such as methods utilizing excited species, including in situ plasma-generated excited species. The deposition method may be a chemical vapor deposition (CVD) process. More preferably the silicon nitride layer is deposited by remote plasma enhanced chemical vapor deposition (RPECVD). An exemplary RPECVD process is described in U.S. Pat. No. 6,544,900, issued Apr. 8, 2003, incorporated herein by reference.

A typical silicon nitride deposition process uses $SiH_4$ (silane) as the silicon source material. Suitable alternative silicon source gases include, without limitation, disilane ($Si_2H_6$), and tri-silane ($Si_3H_8$).

In a preferred process, nitrogen radicals are generated in a remote plasma chamber and are provided to the reaction chamber simultaneously with the silicon source gas. Preferably the nitrogen radicals are generated from nitrogen gas, but other nitrogen source gases can be used.

In a preferred embodiment, silane is supplied to the reaction space with a carrier gas. For example, about 1 sccm to about 20 sccm of silane is provided. Nitrogen radicals are provided to the reaction space by flowing about 1 slm to about 10 slm of $N_2$ through the remote plasma generator, where it is subjected to about 500 W to about 2,000 W of microwave energy.

The silicon precursor, such as $SiH_4$, and the nitrogen radicals can be fed simultaneously to the reactor. However, in other embodiments alternating supply of a silicon source gas and nitrogen radicals or the pulsed supply of a silicon source gas in a continuous flow of nitrogen radicals is contemplated.

In some arrangements, $NH_3$ is added to the nitrogen radical supply to tailor the deposition rate of silicon nitride by providing additional nitrogen.

By the use of nitrogen radicals, high-quality films with a low hydrogen content are obtained. Therefore, the films are referred to as $Si_3N_4$ although a few at. % of hydrogen might be present in the films, depending on deposition temperature.

The deposition of the silicon nitride layer is preferably carried out at a temperature between about 250° C. and about 650° C. Typical prior art CVD processes for depositing silicon nitride, including radical-enhanced CVD processes, were carried out at temperatures above 650° C., as it was believed that lower temperatures would slow the deposition time to unacceptable levels.

Figure 1:
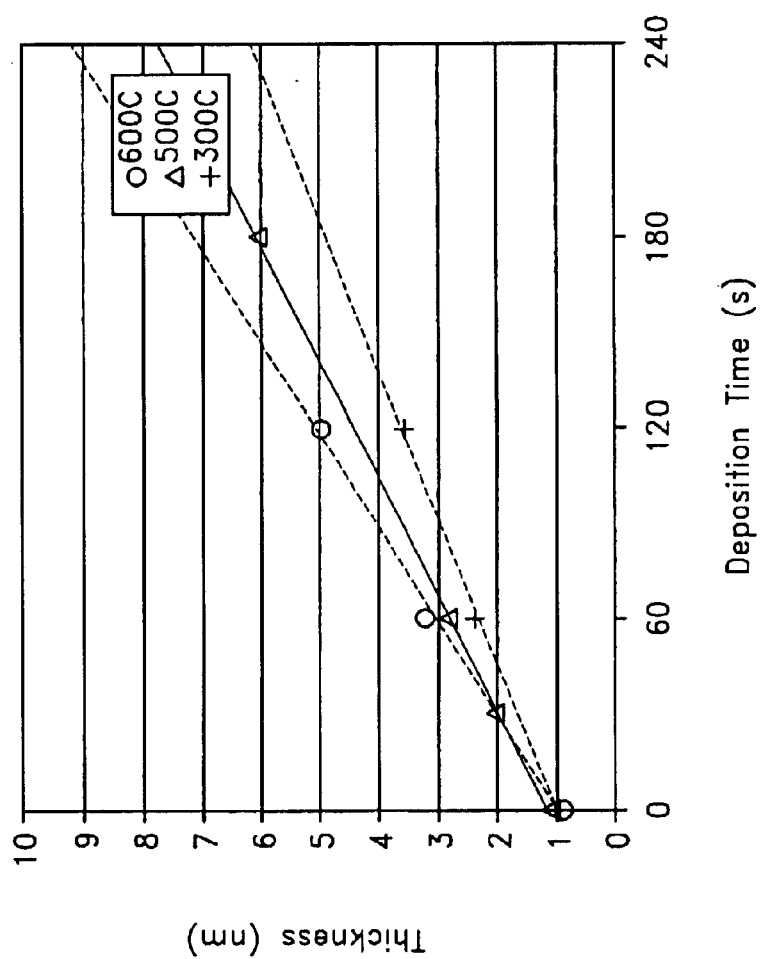
FIG. 1 shows the thickness of a silicon nitride thin film deposited from nitrogen radicals and silane gas in an RPECVD process versus deposition time for various deposition temperatures.

FIG. 1 shows the deposition rate of silicon nitride from nitrogen radicals and silane using an RPECVD process. Deposition temperatures of 300° C. to about 650° C. were employed. In these experiments, the deposition temperature was controlled by a closed-loop control system employing thermocouples located adjacent to the wafer support. Thus, the substrate temperature was controlled indirectly and the actual substrate temperature may have varied by a few degrees from the deposition temperatures that were set.

Deposition was carried out in an Epsilon™ reactor, available from ASM International (Bilthoven, Netherlands). In some embodiments, however, deposition is carried out in a hot wall reactor, such as that described in U.S. patent application Set. No. 09/801,542, filed Mar. 7, 2001, incorporated herein by reference in its entirety. An exemplary hot wall reactor is the Pulsar™ reactor, available from ASM International (Bilthoven, Netherlands).

As can be seen in the figure, using the disclosed RPECVD processes the deposition temperature can be decreased substantially from about 650° C. to about 300° C. with only a limited reduction in deposition rate. For example, after a 240 s deposition time the film thickness is about 9, 8 and 5 nm, respectively, for deposition temperatures of about 600° C., about 500° C. and about 300° C. Although the results shown in FIG. 1 were obtained by the use of mono-silane, $SiH_4$, alternatively higher silanes such as di-silane, $Si_2H_6$, or tri-silane, $Si_3H_8$, can be utilized in the nitride deposition process.

The silicon nitride layer preferably is deposited to a thickness between about 0.2 nm and about 1 nm. More preferably, the silicon nitride layer is deposited to a thickness from about 0.3 to about 0.7 nm and most preferably about 0.5 nm. Thus, it is economically reasonable to produce the films by the RPECVD process at a temperatures between about 250° C. and about 650° C.

For a preferred nitride film thickness of about 0.5 nm, the deposition time at 300° C. is about 24 s. As 24 seconds is a suitable time for economic production, in a preferred embodiment of the present invention a silicon nitride deposition temperature of between about 295° C. and about 305° C., more preferably about 300° C. is selected.

It is preferable to deposit the high-k dielectric oxide and the silicon nitride under substantially isothermal conditions. Preferably the metal oxide dielectric layer and the silicon nitride layer are deposited at temperatures within about 100° C. of each other, more preferably within about 50° C. of each other, yet more preferably within about 100° C. of each other, and most preferably at about the same temperature. Thus as used herein, the term "substantially isothermal" refers to temperatures that differ by no more than about 100° C.

By keeping deposition temperatures substantially isothermal, the time and energy spent heating and cooling the reaction chamber is minimized, thus enhancing the economics of the deposition processes. Further, the process is enhanced by minimizing thermal stresses, which may cause peeling of the layers from the substrate.

In a preferred embodiment a temperature of about 300° C. is selected for the deposition of the high k dielectric and deposition of the silicon nitride. However, somewhat higher or lower temperatures are possible. A temperature for the substantially isothermal processes of the present invention is preferably in the range of about 250° C. to about 400° C., more preferably from about 295° C. to about 305° C., and most preferably about 300° C.

As with temperature, it is desirable to utilize a substantially similar operating pressure for the high k dielectric deposition process and the silicon nitride deposition process. In the preferred embodiments the pressure is preferably in the range of about 0.5 Torr to about 10 Torr, and more preferably is about 2.5 Torr. However, as the pressure can be adjusted quickly when switching from one process to the other, the operating pressures for the ALD process and the silicon nitride process can be different.

Film stacks of different compositions can be deposited utilizing the methods of the present invention. In one embodiment, a simple film stack comprising a HfO$_2$ bottom layer and a Si$_3$N$_4$ top layer are deposited, preferably in situ. The HfO$_2$ preferably has a thickness from about 1 to about 5 nm, more preferably from about 2 to about 4 nm and most preferably about 3 nm. The Si$_3$N$_4$ layer preferably has a thickness from about 0.2 nm to about 1.0 nm, more preferably from about 0.3 to about 0.7 nm and most preferably about 0.5 nm.

In other embodiments, more advanced film stacks are deposited in situ. Exemplary stacks include, without limitation, a Si$_3$N$_4$-HfO$_2$-Si$_3$N$_4$ stack, a HfO$_2$-Si$_3$N$_4$-HfO$_2$-Si$_3$N$_4$ stack and a Si$_3$N$_4$-HfO$_2$-Si$_3$N$_4$-HfO$_2$-Si$_3$N$_4$ stack. The more advanced film stacks are deposited by repeating the deposition of high-k metal oxides and silicon nitride, such as by alternating the ALD and RPECVD processes.

In the case of a stack comprising Si$_3$N$_4$-HfO$_2$-Si$_3$N$_4$, the HfO$_2$ preferably has a thickness between about 1 and about 5 nm, and more preferably has a thickness from about 2 nm to about 4 nm and most preferably has a thickness of about 3 nm. The individual Si$_3$N$_4$ layers preferably have a thickness between about 0.2 and 1.0 nm, and more preferably have a thickness from about 0.3 to about 0.7 nm, and most preferably have a thickness of about 0.5 nm.

In stacks comprising HfO$_2$-Si$_3$N$_4$-HfO$_2$-Si$_3$N$_4$ or stacks comprising Si$_3$N$_4$-HfO$_2$-Si$_3$N$_4$-HfO$_2$-Si$_3$N$_4$, the HfO$_2$ layers preferably have a thickness between about 0.5 and about 2.5 nm, more preferably from about 1 nm to about 2 nm, and even more preferably have a thickness of about 1.5 nm. The individual Si$_3$N$_4$ layers preferably have a thickness between about 0.2 and about 1.0 nm and more preferably have a thickness from about 0.3 to about 0.7 nm. Most preferably they have a thickness of about 0.5 nm.

In the preferred embodiment the top film in the gate stack is a silicon nitride film. This helps to prevent undesirable interactions between the HfO$_2$ layer and the gate electrode material (e.g., polysilicon film) deposited on top of the gate dielectric stack, as described below.

An optional anneal can follow nitride deposition, for example to densify the deposited silicon nitride. The anneal may include nitriding agents and/or oxidizing agents. The temperature for the anneal can be lowered by the injection of N radicals, preferably generated remotely. In one embodiment the anneal is conducted at about 680° C.

Figure 3:
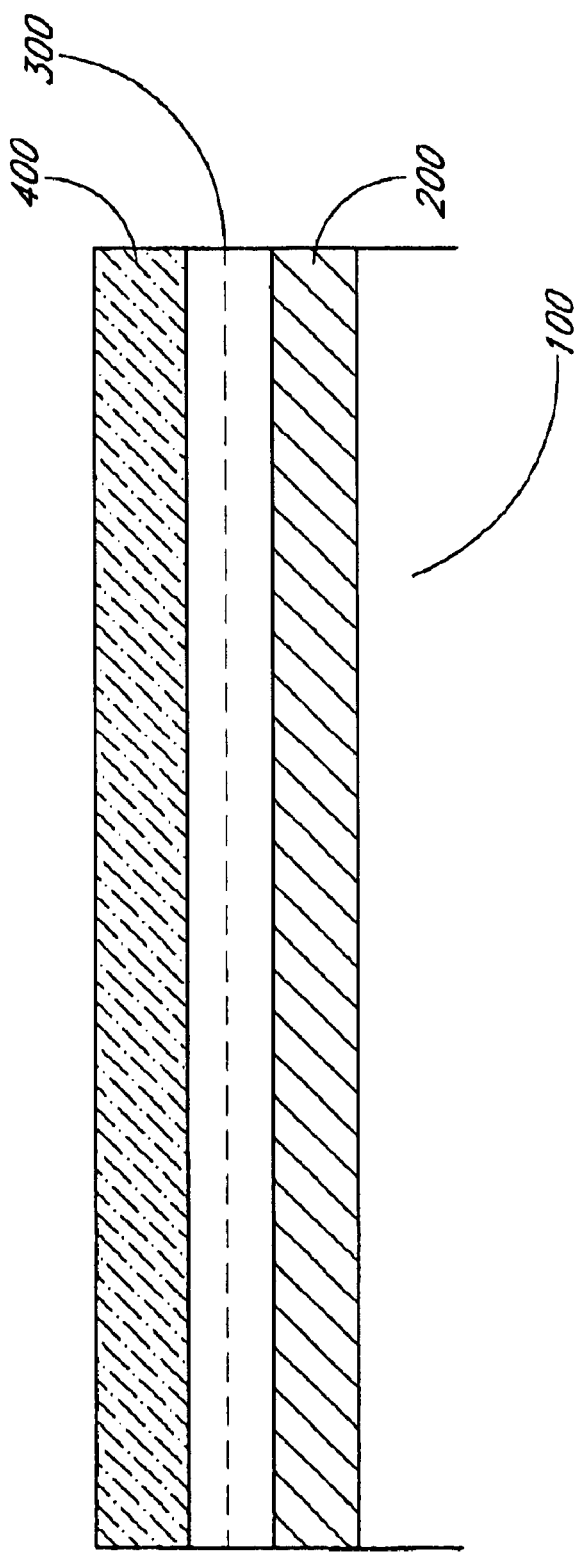
FIG. 3 illustrates a dielectric gate stack and gate electrode deposited on a semiconductor substrate.

Following deposition of the gate dielectric stack, a gate electrode is deposited. In the illustrated embodiment, a polysilicon or amorphous silicon film 400 is deposited over a gate stack comprising a metal oxide dielectric layer 200 and a silicon nitride layer 300 (FIG. 3). The thickness of the gate electrode deposited onto the gate dielectric stack is typically between about 40 and about 200 nm. The polysilicon or amorphous film can be deposited by methods that are well known in the art, such as by CVD.

Advantageously, the preferred embodiments allow for deposition of a first layer on a substrate in a reaction chamber by ALD, followed by deposition of a second layer by an RPECVD process. Because the processes are preferably carried out under substantially isothermal conditions, it is not necessary to heat or cool the chamber and the two processes can be carried out in situ. This avoids the problems associated with transferring the wafer between reactors for each subsequent deposition process, such as wafer contamination, and speeds up the processing time.

Although the foregoing invention has been described in terms of certain preferred embodiments, other embodiments will be apparent to those of ordinary skill in the art. For example, while processes are specifically provided for forming gate dielectrics in an integrated circuit, the skilled artisan will recognize that the same principles can be applied to other contexts, such as the formation of a high-k dielectric over a silicon bottom electrode for a capacitor. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

What is claimed is:

1. A method for forming a high-k gate dielectric stack on a substrate comprising:
   loading the substrate into a reaction chamber;
   depositing a high-k dielectric layer comprising metal oxide onto the substrate by an atomic layer deposition (ALD) process; and
   depositing a silicon nitride layer onto the substrate by a chemical vapor deposition (CVD) process under substantially isothermal conditions with the ALD process, wherein the substrate is not removed from the reaction chamber between deposition of the high-k dielectric layer and deposition of the silicon nitride layer.

2. The method of claim 1, wherein the silicon nitride layer is deposited over the high-k dielectric layer.

3. The method of claim 1, wherein the high-k dielectric layer is deposited over the silicon nitride layer.

4. The method of claim 1, wherein the substantially isothermal conditions comprise temperatures that differ by less than about 50° C.

5. The method of claim 1, wherein substantially isothermal conditions comprise deposition at a temperature between about 250° C. and about 400° C.

6. The method of claim 5, wherein substantially isothermal conditions comprise deposition at a temperature from about 295° C. to about 305° C.

7. The method of claim 1, wherein the metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

8. The method of claim 1, wherein the metal oxide is selected from the group consisting of HfO$_2$, HfSiO$_4$, ZrO$_2$ and ZrSiO$_4$.

9. The method of claim 1, wherein the silicon nitride layer comprises Si$_3$N$_4$.

10. The method of claim 1, wherein the silicon nitride layer is deposited by a remote plasma enhanced chemical vapor deposition (RPECVD) process.

11. The method of claim 10, wherein the RPECVD process comprises providing nitrogen radicals and a silane gas to the reaction space.

12. The method of claim 11, wherein the RPECVD process comprises providing nitrogen radicals and a silane gas to the reaction space simultaneously.

13. The method of claim 1, wherein the ALD process comprises providing alternating pulses of a metal source chemical and an oxygen source chemical.

14. The method of claim 13, wherein the metal source chemical is HfCl$_4$.

15. The method of claim 13, wherein the oxygen source chemical is H$_2$O.

16. The method of claim 1, wherein the high-k dielectric layer is deposited to a thickness of about 2 nm to about 4 nm.

17. The method of claim 16, wherein the high-k dielectric layer is deposited to a thickness of about 3 nm.

18. The method of claim 1, wherein the silicon nitride layer is deposited to a thickness of about 0.3 nm to about 0.7 nm.

19. The method of claim 18, wherein the silicon nitride layer is deposited to a thickness of about 0.5 nm.

20. The method of claim 1, additionally comprising depositing a layer of polysilicon over the gate dielectric stack.

21. The method of claim 1, additionally comprising forming an interface layer on the substrate prior to forming the high-k dielectric gate stack.

22. The method of claim 21, wherein the interface layer is a silicon oxide or silicon oxynitride layer.

23. A process for forming a gate dielectric stack in an integrated transistor on a semiconductor substrate comprising:

depositing one or more high-k dielectric layers on the semiconductor substrate in a processing chamber by an atomic layer deposition (ALD) process; and alternating with the deposition of the one or more high-k dielectric oxide layers, depositing one or more silicon nitride layers on the semiconductor substrate in the reaction chamber by a chemical vapor deposition (CVD) process, wherein the ALD and CVD processes are carried out at substantially isothermal conditions.

24. The method of claim 23, wherein the ALD and CVD processes are carried out within the same processing chamber.

25. The method of claim 23, wherein the substantially isothermal conditions comprise temperatures that differ by less than about 50° C.

26. The method of claim 23, wherein substantially isothermal conditions comprise deposition at a temperature between about 250° C. and about 400° C.

27. The method of claim 26, wherein substantially isothermal conditions comprise deposition at a temperature between about 295° C. and about 305° C.

28. A method of depositing two or more layers on a substrate comprising in situ:

depositing a first layer on a substrate in a reaction chamber by an atomic layer deposition (ALD) process; and depositing a second layer on the substrate in the reaction chamber by a remote plasma enhanced chemical vapor deposition process (RPECVD), wherein the ALD process and the RPECVD process are conducted under substantially isothermal conditions.

29. The method of claim 28, wherein the ALD process and the RPECVD process are conducted at temperatures that are within about 50° C. of each other.

30. The method of claim 28, wherein the ALD process and the RPECVD process are conducted at temperatures between about 250° C. and about 400° C.

31. The method of claim 30, wherein substantially isothermal conditions comprise deposition at a temperature between about 295° C. and about 305° C.

32. The method of claim 28, wherein the first layer comprises a high k metal oxide.

33. The method of claim 28, wherein the second layer comprises silicon nitride.

34. The method of claim 28, wherein the first layer is deposited over the second layer.

35. The method of claim 28, wherein the second layer is deposited over the first layer.

* * * * *

UNITED STATES PATENT AND TRADEMARK OFFICE
CERTIFICATE OF CORRECTION

| | | |
|---|---|---|
| PATENT NO. | : 6,818,517 B1 | |
| APPLICATION NO. | : 10/652851 | |
| DATED | : November 16, 2004 | |
| INVENTOR(S) | : Maes | |

It is certified that error appears in the above-identified patent and that said Letters Patent is hereby corrected as shown below:

In Col. 1, lines 43-44, please delete "$HfO_2$-$Si_3N_4$-$HfO_2$-$Si_3N_4$-$HfO_2$-$Si_3N_4$-$HfO_2$-$Si_3N_4$" and insert --$HfO_2$-$Si_3N_4$-$HfO_2$-$Si_3N_4$ and $Si_3N_4$-$HfO_2$-$Si_3N_4$-$HfO_2$-$Si_3N_4$-- therefor.

In Col. 2, line 28, please delete "Th" and insert -- Tb-- therefor.

In Col. 5, line 24, please delete "disilane" and insert --di-silane-- therefor.

In Col. 6, line 5, please delete "Set." before "No.".

In Col. 6, line 38, please delete "100°C." and insert 10°C.-- therefor.

Signed and Sealed this

Twenty-first Day of November, 2006

JON W. DUDAS
*Director of the United States Patent and Trademark Office*